US 6,652,904 B1

(12) United States Patent
Phani et al.

(10) Patent No.: US 6,652,904 B1
(45) Date of Patent: Nov. 25, 2003

(54) METHODS TO MANUFACTURE SINGLE CELL AND MULTI-CELL REGENERATIVE PHOTOELECTROCHEMICAL DEVICES

(75) Inventors: George Phani, Illawong (AU); Jason Andrew Hopkins, Heathcote (AU); David Vittorio, Mortdale (AU)

(73) Assignee: Sustainable Technologies International Pty. Limited (AU)

( * ) Notice: Subject to any disclaimer, the term of this patent is extended or adjusted under 35 U.S.C. 154(b) by 0 days.

(21) Appl. No.: 09/980,268

(22) PCT Filed: Mar. 30, 2000

(86) PCT No.: PCT/AU00/00274

§ 371 (c)(1),
(2), (4) Date: Nov. 30, 2001

(87) PCT Pub. No.: WO00/59816

PCT Pub. Date: Oct. 12, 2000

(30) Foreign Application Priority Data

Mar. 30, 1999 (AU) .............................................. PP 9539

(51) Int. Cl.⁷ ........................ H01L 31/18; H01M 6/36; B65G 49/06; B65G 35/04; H01G 9/20
(52) U.S. Cl. ........................ 427/74; 438/61; 438/62; 438/64; 438/67; 438/80; 438/85; 136/244; 136/245; 136/251; 136/263; 257/43; 257/433; 257/431; 429/111
(58) Field of Search .................. 438/61, 62, 64, 438/67, 80, 85; 136/244, 245, 251, 263; 257/43, 433, 431; 429/111; 427/74

(56) References Cited

U.S. PATENT DOCUMENTS

| 4,133,697 A | * | 1/1979 | Mueller et al. .............. 136/245 |
| 5,273,608 A | * | 12/1993 | Nath ........................... 156/301 |
| 5,328,546 A | | 7/1994 | Brady et al. |
| 5,735,966 A | * | 4/1998 | Luch ........................... 136/244 |
| 6,069,313 A | * | 5/2000 | Kay ........................... 136/249 |
| 6,350,946 B1 | * | 2/2002 | Miyake et al. ............... 136/252 |
| 6,469,243 B2 | * | 10/2002 | Yamanaka et al. .......... 136/263 |

FOREIGN PATENT DOCUMENTS

| CA | 1309510 | 10/1992 |
| EP | 66339 | 12/1982 |
| EP | 725559 | 8/1996 |
| EP | 744286 | 11/1996 |
| JP | 4-69618 A | * 3/1992 |

* cited by examiner

*Primary Examiner*—Alan Diamond
(74) *Attorney, Agent, or Firm*—Ostrolenk, Faber, Gerb & Soffen, LLP

(57) ABSTRACT

The present invention relates to manufacturing of regenerative photovolatic photoelectrochemical (RPEC) devices. The invention describes a method for manufacturing RPEC devices in a production line. The method comprises the steps of: dispensing a protective film in a substantially continuous sheet; attaching at least one substrate to the protective film in such a way that predetermined areas of the substrate are protected from being coated during at least one subsequent manufacturing process; using the protective films as a means to transport the substrate, along the production line through the at least one subsequent manufacturing process.

22 Claims, 3 Drawing Sheets

METHODS TO MANUFACTURE SINGLE CELL AND MULTI-CELL REGENERATIVE PHOTOELECTROCHEMICAL DEVICES

TECHNICAL FIELD

This invention relates to single cell and multi-cell regenerative photovoltaic photoelectrochemical (RPEC) devices, and to materials and methods used for manufacture of such devices.

Examples of the RPEC cells of the type concerned are disclosed in the following U.S. patents.

U.S. Pat. No. 4,927,721, Photoelectrochemical cell; Michael Graetzel and Paul Liska, 1990.

U.S. Pat. No. 5,350,644, Photovoltaic cells: Michael Graetzel, Mohammad K Nazeeruddin and Brian O'Regan, 1994.

U.S. Pat. No. 5,525,440, Method of manufacture of photo-electrochemical cell and a cell made by this method; Andreas Kay, Michael Graetzel and Brian O'Regan, 1996.

U.S. Pat. No. 5,728,487, Photoelectrochemical cell and electrolyte for this cell; Michael Graetzel Yordan Athanassov and Pierre Bonhote, 1998.

BACKGROUND TO THE INVENTION

RPEC cells, as of the type disclosed in the above patents, are capable of being fabricated in a laminate arrangement between two large area substrates without undue expense. One typical arrangement involves two glass substrates, each utilising an electrically conducting coating upon the internal surface of the substrate. Another typical arrangement involves the first substrate being glass or polymeric and utilising an electrically conducting coating upon the internal surface of the substrate, with the second substrate being polymeric. In some arrangements, the internal surface of said second polymeric substrate is coated with an electrically conducting coating, whereas in other arrangements, said second polymeric substrate comprises a polymeric foil laminate, utilising adjacent electrically conductive material, such as carbon. Also, in some arrangements, the external surface may be a laminated metal film, and in other arrangements, the external surface may be coated by a metal. At least one of said first and second substrates is substantially transparent to visible light, as in the attached transparent electrically conducting (TEC) coating. RPEC cells contain a photoanode, typically comprising a ruthenium dye-sensitised, nanoporous semiconducting oxide (eg. titania) layer attached to one conductive coating, and a cathode, typically comprising a redox electrocatalyst layer attached to the other conductive coating or conductive material. An electrolyte containing a redox mediator is located between the photoanode and cathode, and the electrolyte is sealed from the environment. If one or more polymer substrates are utilised, the photoanode and the cathode are typically electrically separated by a porous insulating layer (eg. insulating ceramic oxides) or spacer(s) (eg. insulating spheres). TEC coatings, which usually comprise a metal oxide(s), have high resistivity when compared with normal metal conductors, resulting in high resistive losses for large area RPEC cells operating under high illumination. When operating under high illumination, one method to minimise these losses is the deposition of one or more networks of electrically conductive material that serve to collect and/or distribute electrons in the cell. Another method to minimise these losses is by connecting a multiple of RPEC cells (here called 'RPEC modules') in series to generate higher voltages and to minimise total current. Such connections in RPEC modules may be made externally or internally (International Application PCT/AU00/00190). To enable internal series connection of adjacent RPEC cells, selected areas of such conducting coatings must be electrically isolated, portions of such areas overlapped when laminated, interconnects used to connect such overlapped areas and electrolyte-impermeable barriers used to separate the electrolyte of individual cells.

One example of the manufacture of an RPEC module involves the use of two glass substrates that have TEC-coatings that have been divided into electrically isolated regions. Titanium dioxide (or similar semiconductor) is screen printed onto selected areas of the TEC coating of one substrate and an electrocatalyst is screen printed onto selected areas of the TEC coating of the other substrate. The titanium dioxide (titania) is coated with a thin layer of a dye by immersion of the titania-coated substrate in the dye solution. Strips of sealant and interconnect material are deposited upon one of the substrates and the two substrates are then bonded together. Electrolyte is added to the cells via access apertures in one of the substrates and these apertures are then sealed.

Another example of the manufacture of an RPEC module involves the use of one substrate with a TEC-coating that has been divided into electrically isolated regions. Successive layers of titania, insulating ceramic oxide, and conducting catalytic material (for example, carbon-based) are deposited, for example by screen printing, onto selected areas of the TEC-coated substrate, with the catalytic layer also serving as an interconnect. The titania is coated with a thin layer of the dye by immersion of the multiple-coated substrate in the dye solution. Electrolyte is added to the spaces within the porous titania-insulator-catalytic layers. The sealant face of a sealant/polymer and/or metal foil laminate is sealed to the substrate.

One of the difficulties in the manufacture of RPEC cells and modules is that when the semiconducting oxide-coated substrate is exposed to the dye solution, dye not only adsorbs to the semiconducting oxide, but also to the conductive coating. Similarly, if sealant has been applied to the semiconducting oxide-coated substrate, exposure to the dye solution typically results in dye adsorption to the sealant surface. The adsorbed dye on the conductive coating or sealant can interfere with the strength and/or permeability of any bond made to these surfaces during sealing, and also can affect the performance and service life of the RPEC cell. One process that prevents dye adsorption to the conductive coating involves covering relevant areas of the conducting coating with a polymeric film, application of dye to the coated substrate and then removal of the polymeric film, thus leaving a clean conductive coating surface to which a subsequent seal may be made. Another process that prevents dye adsorption to the conductive coating involves use of a laminated film (eg. surlyn/polypropylene) in which one face (eg. the surlyn face) is sealed to the relevant areas of the conducting coating, after which the dye is applied to the coated substrate and then the upper layer (eg. polypropylene) is removed, thus leaving a clean polymer (eg. surlyn) surface to which a subsequent seal may be made. This subsequent seal may involve additional sealant material or may involve-sealing directly to the sealant surface, with the seal being made to a coated glass substrate or to a polymeric foil laminate, such as surlyn/aluminium. Unfortunately, these protective film processes are inconvenient and time consuming and can result in variability in performance of the RPEC. An additional impediment to a continuous manufacturing process is that dye application to the semiconducting oxide needs to be automated to be carried out efficiently, preferably within a low volume container that may be dark, heated, and provided with a partially sealed, low-oxygen content atmosphere.

SUMMARY OF THE INVENTION

The present invention provides a method for manufacturing regenerative photoelectrochemical (RPEC) devices in a production line, each device being deposited on a substrate, the method comprising the steps of:

attaching at least one substrate to the protective film in such a way that a predetermined areas of the substrate are protected from being coated during at least one subsequent manufacturing process;

The protective film may comprise a patterned composite, laminated or multilayer film (CLM film) and the substrate may be a multiply-coated substrate of RPEC cells and modules. The protective film may be patterned to create apertures, which are used as engagement means and the step of transporting the substrate comprises penetrating the engagement means with teeth to locate and mechanically engage the film in transportation of the film/substrate composite.

The method allows continuous and convenient transport of the CLM film/substrate composite, using the engagement means, through one or more steps of the manufacturing process, including, but not limited to application of dye to the semiconductor oxide, addition of electrolyte, continuous removal of part of said patterned CLM film and sealing of the multiply-coated substrate to another substrate. The patterned film has the advantage of preventing adsorption of dye on the predetermined areas of said substrate. A portion of the part of said patterned film not removed may be utilised as sealant to subsequently bond the substrates of the RPEC cells and modules.

In one embodiment, the present invention provides for application of a continuous patterned CLM film to a multiply-coated substrate of RPEC cells and modules, and continuous and convenient transport of the patterned film/substrate composite through one or more steps of the manufacturing process, including, but not limited to application of dye to the semiconductor oxide, addition of electrolyte, continuous removal of part of said patterned CLM film and sealing of the multiply-coated substrate to another substrate.

The patterned film may be a laminate of two or more polymers plus the option of an external layer of metallic or other materials, whereby one of the external layers of the laminate will function as the sealant of the RPEC device. The other layer(s) of the laminate function to prevent access of the dye, electrolyte, solvents and/or other materials to one face of the sealant layer. The patterned film may be dispensed in a substantially continuous sheet, preferably from a roll, and may be continuously patterned using stamping, rolling or any of the known methods of such patterning, to remove portions of film, thereby leaving apertures, hereby termed access regions, and optionally also leaving other apertures, hereby termed engagement means. If desired, a sealant face of said patterned film and/or predetermined areas of the surface of the multiply-coated substrate are treated with an adhesion promoting means, such as an adhesion primer, corona discharge or other known processes, in order to effect superior adhesion of said treated face and/or said treated surface in the subsequent bonding process, The substrate may be bonded to said patterned film by using roller, hot roller, stamping, or hot stamping processes, or by any of the known methods of such bonding. Particular care must be taken in the bonding process to ensure desired alignment of multiply-coated areas of said substrates with said access regions of said patterned film. Said access regions enable access to at least one selected area of said substrate, by dye solutions, electrolyte, solvents, gases and such like materials in subsequent steps of said continuous manufacturing process. Mechanical contact is made with said patterned film in order to transport said patterned film attached to the substrate i.e. the "film/substrate composite", through subsequent steps of said continuous manufacturing process. Said mechanical contact may comprise any of the known methods of mechanical contact used to transport a film. Said mechanical contact includes, but is not limited to penetration of said engagement means by projections that are then moved to effect said transport, whereby said projections include, but are not limited to teeth of sprockets, teeth in linear placement as in racks, hooks supports and such like mechanical devices as are known to those of ordinary skill in the art. Said sprockets may be round, or essentially triangular, square, polygonal or of any suitable shape, and the apertures comprising the engagement means may be square, round or of any suitable shape, and may form one or more lines along the length of said patterned film. Said mechanical contact may include, but is not limited to opposing sets of rollers touching said film that passes between said sets of rollers, and with first set of rollers moved in opposite rotation to second set of rollers in order to transport said film in the desired direction. Said patterned film/substrate composite may be transported through a dye application chamber that may be dark, heated, and provided with a partially sealed, low-oxygen content atmosphere. Within said dye application chamber, said patterned film/substrate composite may be transported through the dye solution in a zig-zag manner, linearly, or in any other manner to provide effective use of the solution and space. Said dye solution may be agitated, such as by bubbles, stirring, pumping, ultrasonics or other known means of agitation. Said patterned film/substrate composite may be transported through a rinsing chamber, an electrolyte chamber, and other chambers, including but not limited to drying chambers. Part of said patterned film may then be removed in a continuous process, leaving the sealant layer of the patterned film adhering to regions of said multiply-coated substrate. Said mechanical contact with said sealant layer film enables convenient transport of said sealant film/substrate composite through subsequent steps of said continuous manufacturing process, including sealing of exposed surface of clean sealant on said multiply-coated substrate to a second substrate. Said multiply-coated substrate may comprise a TEC-coated glass substrate or a polymeric substrate, upon which subsequent layers of material are deposited. Said second substrate may comprise a TEC-coated glass substrate, a polymeric substrate, or a polymeric/metal foil laminate, such as surlyn/aluminium, whereby part of the polymeric layer (eg. surlyn) of said polymeric/metal foil laminate (eg. surlyn/aluminium) is bonded to said remaining patterned polymeric film (eg. surlyn) that is adhering to regions of the multiply-coated substrate. If used, polymeric substrates and polymeric/metal foil laminates, may be dispensed in a substantially continuous sheet, preferably from a roll.

Throughout this specification, unless the context requires otherwise, the word "comprise" or variations such as "comprises" or "comprising", will be understood to imply the inclusion of a stated element or integer or group of elements or integers but not the exclusion of any other element or integer or group of elements or integers.

BRIEF DESCRIPTION OF THE DRAWINGS

Having broadly portrayed the nature of the present invention, embodiments thereof will now be described by way of example and illustration only. In the following description, reference will be made to the accompanying drawings in which.

DETAILED DESCRIPTION OF THE DRAWINGS

Figure 1:
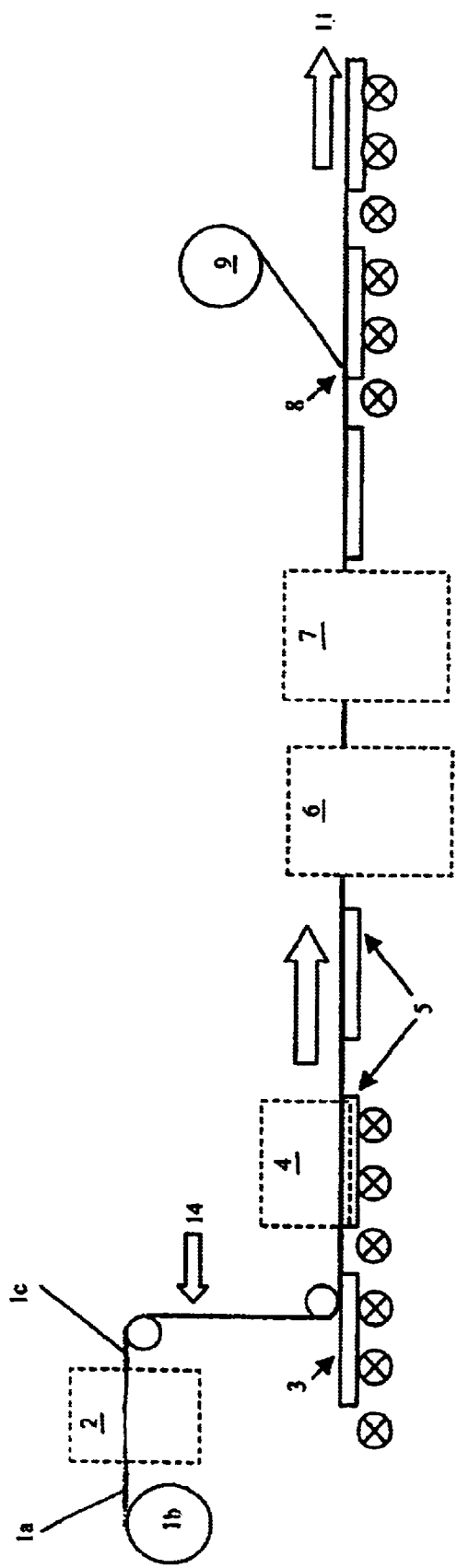
FIG. 1 is a diagrammatic representation of a continuous process for manufacturing RPEC cells and modules in accordance with the chosen example of the invention.
Figure 2:
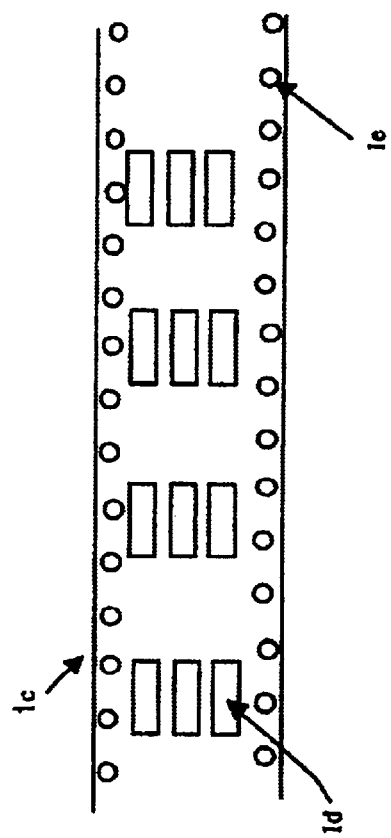
FIG. 2 is a diagrammatic representation of a patterned CLM film in accordance with the chosen example of the invention.
Figure 3:
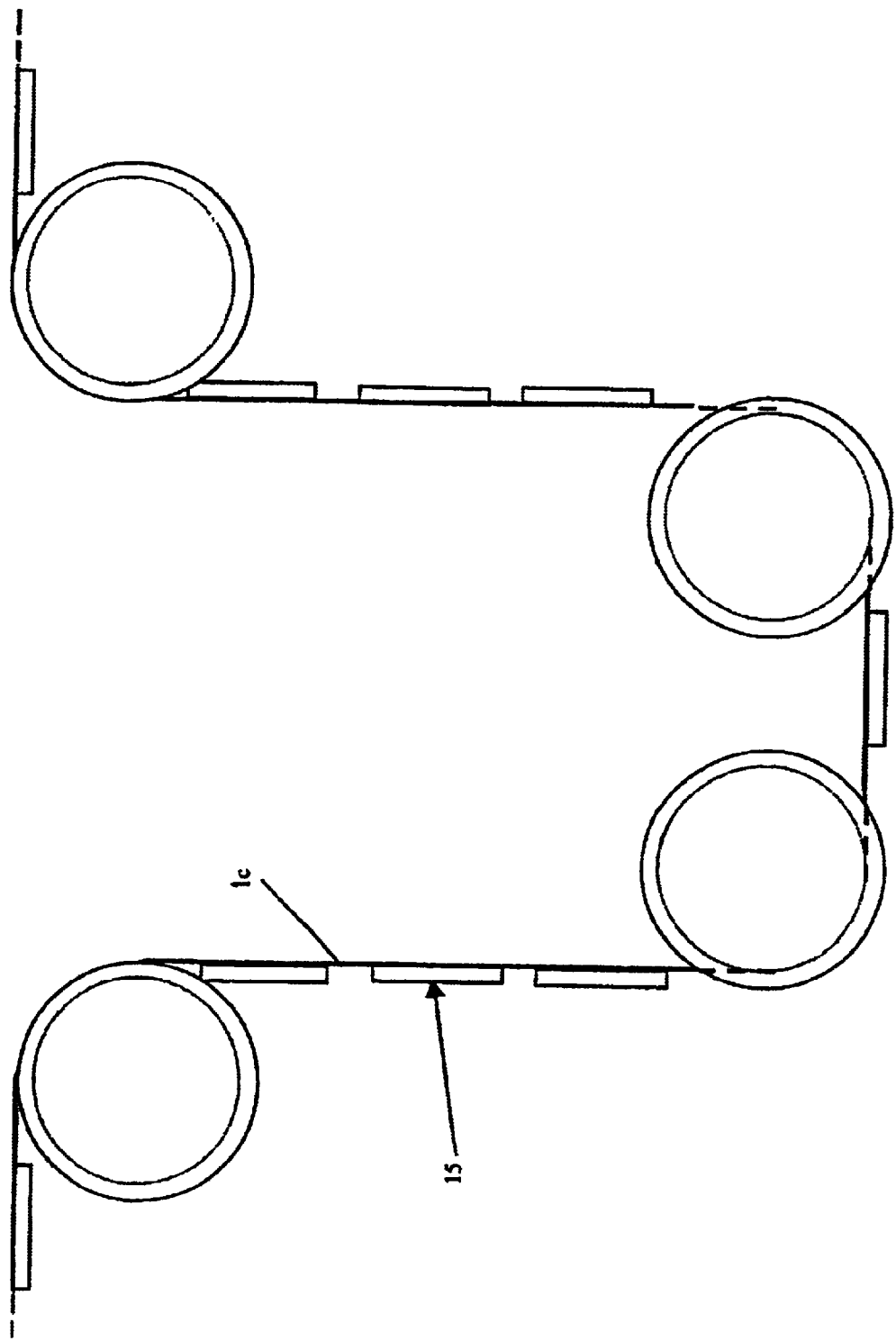
FIG. 3 is a diagrammatic representation of a patterned CLM film/substrate composite being transported through a dyeing chamber in a zig-zag manner in accordance with the chosen example of the invention.

Referring to FIG. 1, a CLM film (1a) is dispensed from a roll (1b) and is subjected to a patterning process (2) whereby portions of film are removed, leaving a patterned CLM film (1c) with access regions (1d) and engagement means in the form of apertures (1e), as shown in FIG. 2. The patterned CLM film-(1a) is then treated with adhesion promoters (3) as are selected areas of the surfaces of the multiply-coated glass substrates (3). The multiply-coated substrates are then bonded (4,5) to the continuous patterned CLM film (1a), ensuring desired alignment of multiply-coated areas of the substrates with the access regions of the patterned CLM film. The patterned CLM film/substrate composite is then transported through subsequent steps of the continuous manufacturing process by mechanical contact of sprocket teeth with the engagement means of the patterned CLM film. The patterned CLM film/substrate composite is then transported through a low volume dyeing chamber (6) that is dark, heated, and provided with a partially sealed, low-oxygen content atmosphere. Within the dyeing chamber, the patterned CLM film/substrate composite is transported through a stirred dye solution in a zig-zag manner as shown in FIG. 3. The patterned CLM film/substrate composite is then transported through a chamber (7) where the composite is rinsed, dried and exposed to electrolyte solution. The upper layer of the patterned CLM film (1c) is then peeled from the CLM/ film/substrate composite in a continuous process (8), and collected upon a roller (9), leaving exposed the upper surface of the sealant layer of the patterned sealant film/substrate composite. The patterned sealant film/substrate composite is then transported through subsequent steps of the continuous manufacturing process by mechanical contact of sprocket teeth with the engagement means of the patterned sealant film. The sealant surface of a sealant/metal foil laminate is disposed from a roll (not shown) and then sealed (11) to the exposed surface of clean sealant on the patterned sealant film/substrate composite.

Referring to FIG. 2, the access regions (1d) (rectangles) and engagement means (1e) (circles) of a patterned CLM film (1c) are shown as viewed from the direction of the arrow 14 in FIG. 1.

Referring to FIG. 3, a patterned CLM film/substrate composite 15 is shown being transported through a dyeing chamber in a zig-zag manner.

Figure 4:
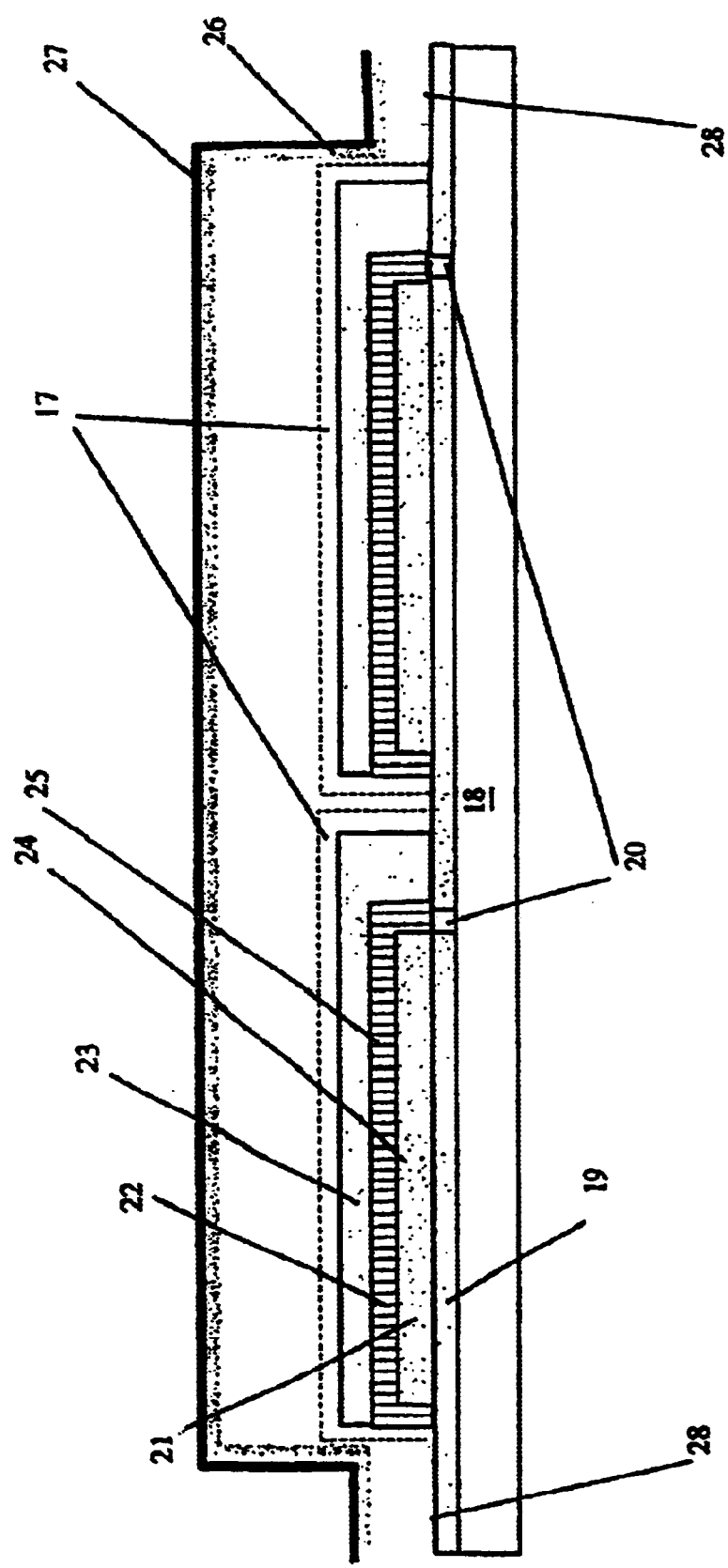
FIG. 4 is a diagrammatic representation of example of an RPEC module based on 1 glass substrate in accordance with the chosen example of invention

Referring to FIG. 4, an RPEC module consists of two RPEC elements (17) deposited on a substrate (18). The substrate (18) is covered by a Transparent Electron Conductor-TEC (19), electrically isolated in certain areas (20) Each of two of the RPEC elements (17) contains a titanium dioxide (titania) layer (21), an insulating layer (22) and a catalytic conductor layer (23). The titania layer (21) is coated with a thin layer of a dye (24). Electrolyte (25) is added to the spaces within the porous titania-insulator-catalytic layers. A laminate formed by a polymeric layer (26) and a metal foil (27) is bonded to remaining patterned polymeric film (28) adhering to regions of the multiply-coated substrate (18).

What is claimed is:

1. A method for manufacturing regenerative photoelectrochemical (RPEC) devices in a production line, each device being deposited on a substrate, the method comprising the steps of:

dispensing a protective film in a substantially continuous sheet, the protective film being provided with apertures spaced along its length and the apertures extending between both faces of the film;

attaching at least one substrate to the protective film at a predefined position transporting the substrate by way of the protective film along the production line to at least one subsequent manufacturing process;

predefined areas of the substrate are protected by the protective film from being coated during the at least one subsequent manufacturing process; and at least some of the apertures define accessible areas of the substrate and expose these areas to being coated during the at least one subsequent manufacturing process.

2. The method according to claim 1, wherein the at least one subsequent manufacturing process coats the substrate with one or more device layers on at least one accessible area of the substrate.

3. The method according to claim 2, wherein at least one of the device layers comprises a layer of porous large band gap semiconducting oxide.

4. The method according to claim 2, wherein the one or more device layers comprise porous layers of:

large band gap semiconducting oxide;

insulating ceramic oxide; and a conducting catalytic layer.

5. The method according to claim 3 further including the steps of:

applying a thin layer of dye to said porous large band gap semiconducting oxide layer;

adding electrolyte to spaces within the device layers;

sealing the device by applying a sealant over the whole substrate, wherein a layer of the protective film is arranged to bond to the sealant over the predefined areas.

6. The method according to claim 1, wherein the protective film is dispensed to the production line from a roll.

7. The method according to claim 1 wherein the apertures are created by removing portions of the film.

8. The method according to claim 1 wherein at least some of the apertures comprise engagement means, and the step of transporting the substrate comprises penetrating the engagement means with teeth to mechanically locate and mechanically engage the film to assist transportation through the at least one or more manufacturing processes.

9. The method according to claim 1 wherein one face of the protective film is continuously treated with an adhesion promoting means for improving adhesion of the treated face to the substrate.

10. The method according to claim 1 wherein the substrate is continuously treated with an adhesion promoting means for improving adhesion of the protective film to the substrate.

11. The method according to claim 1 wherein the substrate is attached to the protective film using a roller, hot roller, stamping, or hot stamping.

12. The method according to claim 1 wherein the substrate attached to the protective film is transported through a dyeing chamber.

13. The method according to claim 12 wherein the substrate is transported with the protective film through the dyeing chamber in a zigzag or reciprocating manner.

14. The method of claim 12 wherein a dye solution in the dyeing chamber is agitated.

15. The method according to claim 1 wherein the protective film is a composite, laminated or multilayer (CLM) film in which a first layer arranged to be adjacent to the substrate is a sealant layer, and a second layer is a protective layer.

16. The method according to claim 15, wherein the second layer of the CLM film is removed in a continuous process, leaving the sealant layer adhering to the predefined areas of the substrate.

17. The method according to claim 16 wherein the sealant layer is used to transport the substrate through subsequent manufacturing processes, including sealing of the sealant layer to a second substrate.

18. The method according to claim 17 wherein the second substrate comprises a TEC-coated glass substrate.

19. The method according to claim 17 wherein the second substrate comprises a polymeric substrate.

20. The method according to claim 17 wherein the second substrate comprises a polymeric/metal foil or polymeric/metal/polymeric laminate whereby part of the first polymeric layer in the laminate is arranged to bond to a polymeric layer attached to the predefined areas of the substrate.

21. The method according to claim 19 wherein the second substrate is dispensed in a substantially continuous sheet.

22. The method according to claim 21 wherein the second substrate is dispensed from a roll.

* * * * *